US 6,558,046 B2

(12) United States Patent
Griffis et al.

(10) Patent No.: US 6,558,046 B2
(45) Date of Patent: May 6, 2003

(54) OPTICAL WAVELENGTH DIVISION MULTIPLEXER AND/OR DEMULTIPLEXER WITH MECHANICAL STRAIN RELIEF

(75) Inventors: Jeffrey A. Griffis, Redwood City, CA (US); Roderick P. McAfee, Pleasanton, CA (US); Curtis A. Ray, Alamo, CA (US); Hong Li, San Ramon, CA (US)

(73) Assignee: Blaze Network Products, Inc., Pleasanton, CA (US)

( * ) Notice: Subject to any disclaimer, the term of this patent is extended or adjusted under 35 U.S.C. 154(b) by 262 days.

(21) Appl. No.: 09/805,512

(22) Filed: Mar. 12, 2001

(65) Prior Publication Data
US 2001/0043778 A1 Nov. 22, 2001

Related U.S. Application Data

(63) Continuation-in-part of application No. 09/347,490, filed on Jul. 2, 1999, now Pat. No. 6,201,908.

(51) Int. Cl.[7] .................................................. G02B 6/36
(52) U.S. Cl. .......................... 385/76; 385/92; 439/931
(58) Field of Search .............................. 385/24, 47, 51, 385/52, 53, 76, 88, 92; 439/76.1, 455, 465, 701, 731

(56) References Cited

U.S. PATENT DOCUMENTS

| 4,244,045 | A | * | 1/1981 | Nosu et al. ................. 359/129 |
| 5,119,454 | A | * | 6/1992 | McMahon ..................... 385/49 |
| 5,138,678 | A | * | 8/1992 | Briggs et al. ................. 385/86 |
| 5,894,535 | A | * | 4/1999 | Lemoff et al. ................ 385/47 |
| 6,122,417 | A | * | 9/2000 | Jayaraman et al. ........... 385/24 |

* cited by examiner

Primary Examiner—Khiem Nguyen
(74) Attorney, Agent, or Firm—Bruce H. Johnsonbaugh

(57) ABSTRACT

An optical wavelength multiplexer and/or demultiplexer is provided having mechanical strain relief. The mechanical strain relief is provided by mounting ears carried by a molded coupling module supporting the fiber optic cable receptacle. The mounting ears are engaged by a pair of mounting plates carried by a housing for the device. Loads applied to the fiber optic cable receptacle are transferred to the housing frame and do not adversely affect the optical pathway of the assembled device.

5 Claims, 6 Drawing Sheets

OPTICAL WAVELENGTH DIVISION MULTIPLEXER AND/OR DEMULTIPLEXER WITH MECHANICAL STRAIN RELIEF

CROSS-REFERENCE TO RELATED APPLICATION

This is a continuation-in-part of U.S. patent application Ser. No. 09/347,490 filed Jul. 2, 1999 now U.S. Pat. No. 6,201,908.

BACKGROUND AND BRIEF SUMMARY OF THE INVENTION

The present invention relates generally to optical wavelength division multiplexers and/or demultiplexers (WDM). More specifically, the present invention relates to a mechanical strain relief for WDM devices. The present invention provides mounting ears formed adjacent one end of the WDM device which carries a fiber optic cable receptacle. The mounting ears are connected to a support for the WDM device so that loads applied to the fiber optic cable receptacle are transferred to the support for the WDM device and do not adversely affect the optical pathway of the assembled WDM device.

The present invention is effective in providing mechanical strain relief for the optic and opto-electronic components carried by the optical block and molded coupling module in the WDM device shown and described in U.S. application Ser. No. 09/347,490, which is incorporated by reference herein as though set forth in full. The design shown in Ser. No. 09/347,490 does not provide for mechanical strain relief between the fiber optic cable receptacle and the remainder of the device. The relatively heavy loads applied to the fiber optic cable receptacle by users can be large enough to damage the WDM device or to adversely affect its performance.

The present invention provides a simple yet robust mechanical strain relief for use WDM devices. The preferred embodiment of the present invention includes mounting integrally formed with a plastic molded coupling module wherein the module carries a optic cable receptacle at one end and a plurality of optical and opto-electronic comp at its other end. The mounting ears transfer loads applied to the fiber optic cable receptacle to a support such as a pluggable housing so that those loads do not adversely affect the optical pathway of the device. The invention provides mechanical strain relief for a WDM device carried in both pluggable and non-pluggable modules or housings wherein loads applied to the fiber optic cable receptacle are directly transferred to the module or housing.

A primary object of the invention is to provide a pluggable or non-pluggable WDM device having mechanical strain relief provided which protects the rather sensitive optical and opto-electronic components of the device from loads applied to the fiber optic cable receptacle.

A further object of the invention is to provide a WDM device cable of mounting in a pluggable housing which transfers loads applied to the fiber optic cable receptacle to the frame of the housing.

Another object of the invention is to provide a pluggable WDM device having mechanical strain relief mounting ears which cooperate with a pair of resilient detents carried in the pluggable module housing.

Other objects and advantages will become apparent from the following description and the drawings wherein:

DETAILED DESCRIPTION OF THE DRAWINGS

Figure 1:
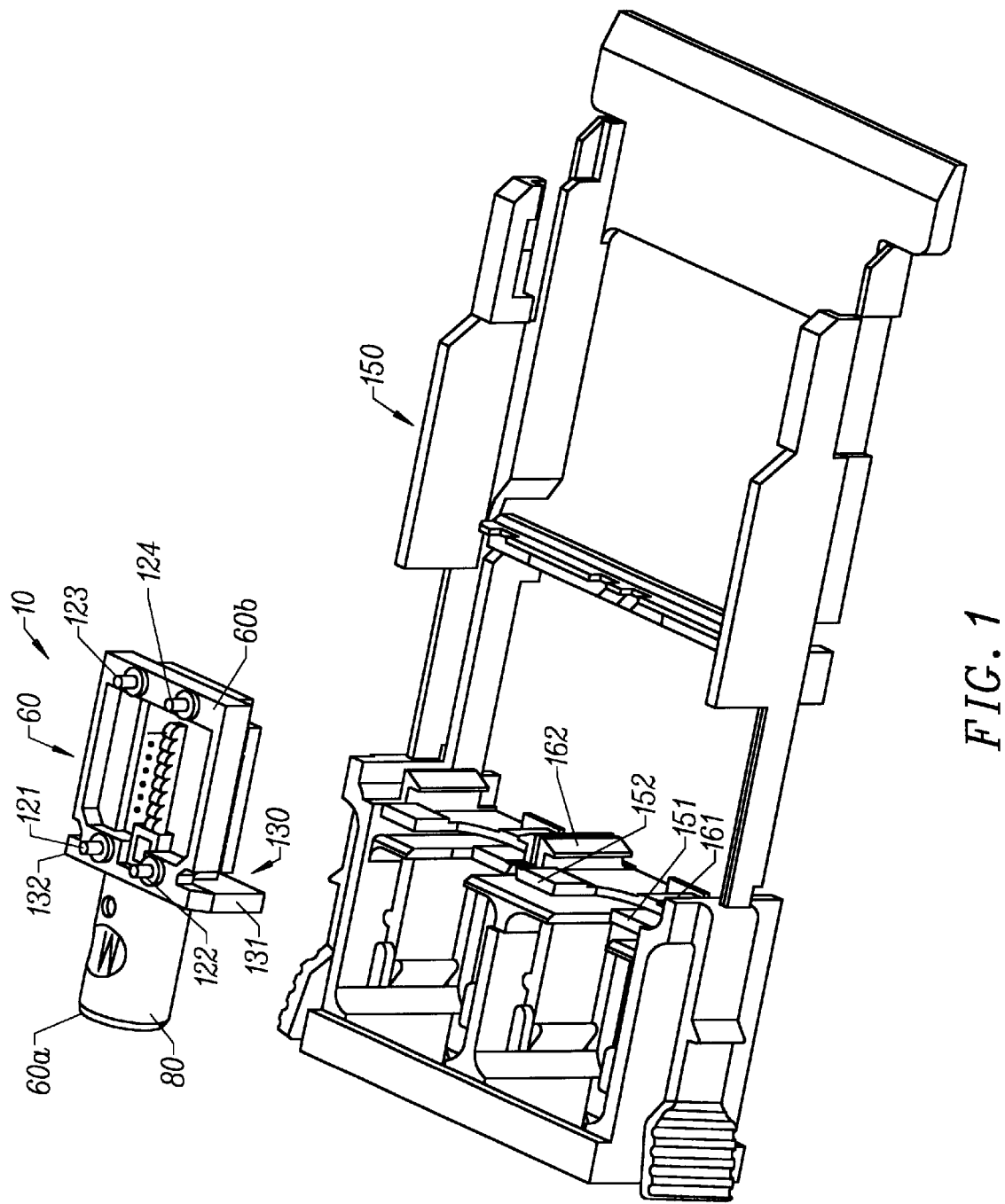
FIG. 1 is a perspective view shown in exploded fashion illustrating a WDM device (without the ceramic substrate) about to be placed in a pluggable housing.

FIGS. 1–5 show the mechanical strain relief aspects of the invention. FIG. 6 shows the preferred WDM design which is described first. FIG. 6 shows the major optical components of the wavelength division multiplexer/demultiplexer 10 which utilizes the present invention. The preferred form of the invention has three primary components bonded together; an optical block 20, a molded coupling module 60 and a ceramic substrate 100. A more detailed description of the device shown in FIG. 6 (without ceramic substrate 100) is contained in application Ser. No. 09/347,490. A portion of that description is repeated here for convenience. The device shown in FIG. 6 has the ability to combine individual light signals into a single optical path which can be directed towards an optical fiber, and/or demultiplex such signals into individual channels. For simplicity of explanation, the demultiplexing functionality is described, since those skilled in the art will readily understand the correlative multiplexing functionality.

FIG. 6 shows the assembled primary components and illustrates the optical pathway 90–96 wherein an incoming signal includes eight separate wavelengths (n wavelengths in the general case), which are separated into eight separate channels to be read by photodetectors 121–128. In the multiplexing mode of the invention, lasers replace photodetectors 121–128. An optical block 20 formed of glass or molded of plastic is shown with a plurality of filters 40 carried on surface 22. The optical block 20 has an outer flat surface 21 which is coated with a reflective material 85.

A molded coupling module 60 has a first flat surface 61 which is adhesively connected to the flat inner surface 22 of optical block 20.

The molded coupling module 60 in the embodiment illustrated in FIG. 6 includes a fiber optic cable receptacle 80 integrally molded therein at the first end 60a of module 60 for receiving the end of a fiber optic cable (not shown) so that the end of the cable engages receptacle seat 81.

As illustrated in FIG. 6, a multiplexed optical beam having 8 wavelengths $\lambda_1-\lambda_8$ moves along optical pathway 90, exits the end of the fiber optic cable (not shown) and begins to diverge as shown at 91. An integrally molded collimating lens 65 collimates the diverging light beam 91 and forms a collimated beam 92. The collimated light beam 92 is reflected off integrally formed reflective surface 66 of the molded coupling module 60 and is directed toward the reflective coating 85 carried by the flat outer surface 21 of the optical block 20. As the light beam moves through that section 93 of the optical pathway, it impinges against the reflective coating 85 at a predetermined angle of incidence as known in the art. The reflected beam 94 is reflected in a zigzag pattern in optical block 20 between the plurality of n filters 40 and the reflective surface 85. As the reflected beam enters each of the n filters, one of the n different wavelengths of light is transmitted through each filter and the separated wavelengths move along the optical pathways 95a through 95h toward the plurality of molded aspheric surfaces 70 formed on second surface 62 of the molded coupling module 60. Each of the n aspheric molded surfaces focuses the separated wavelength bands or channels, as shown for example as 96a, onto separate photodetectors 121–128, as known in the art.

As shown in FIG. 6, the optical block 20 is generally rectangular in shape having flat outer and inner surfaces 21 and 22, a flat proximal end wall 23 and a flat distal wall 24. The optical block in the preferred embodiment of the invention is formed from a high quality optical glass. Alternately, the optical block 20 may be injection molded using high quality optical plastic. The reflective coating 85 is applied to the outer surface 21 of block 20. The reflective coating may be formed of materials conventionally used in this art, such as dielectric interference coatings or metallic coatings.

The optical block 20 has a reflective coating on one side and an array 40 of discrete multiwavelength Fabry-Perot transmission filters on the other side. The precision optical block 20 can be formed of any transparent optical material capable of transmitting light over the desired spectral region and being formed or polished to the correct thickness. The reflective surface 85 can be placed on the optical block by a number of techniques, to include; dielectric interference coatings, metallic coatings, etc.

The plurality of n filters 40 includes eight discrete Fabry-Perot filters mounted on the flat inner surface 22 of optical block 20.

The assembly of the filter array onto the optical block and then the adhesive bonding of the optical block 20 to the molded coupling module 60 achieves a passive optical alignment of the critical optical elements of the device. When assembled as described above, the output beam 91 of the fiber optic cable is directly coupled to the wavelength division multiplexer/demultiplexer 10 and is automatically and passively aligned with the internal optics of the device, including the collimating lens 65, the beam reflection means, the reflective coating 85 on the top surface of optical block 20 as well as with the plurality of filters 40 and the plurality of aspheric surfaces 70. No postfabrication alignment, tuning or adjustment of these optical elements is required.

Figure 4:
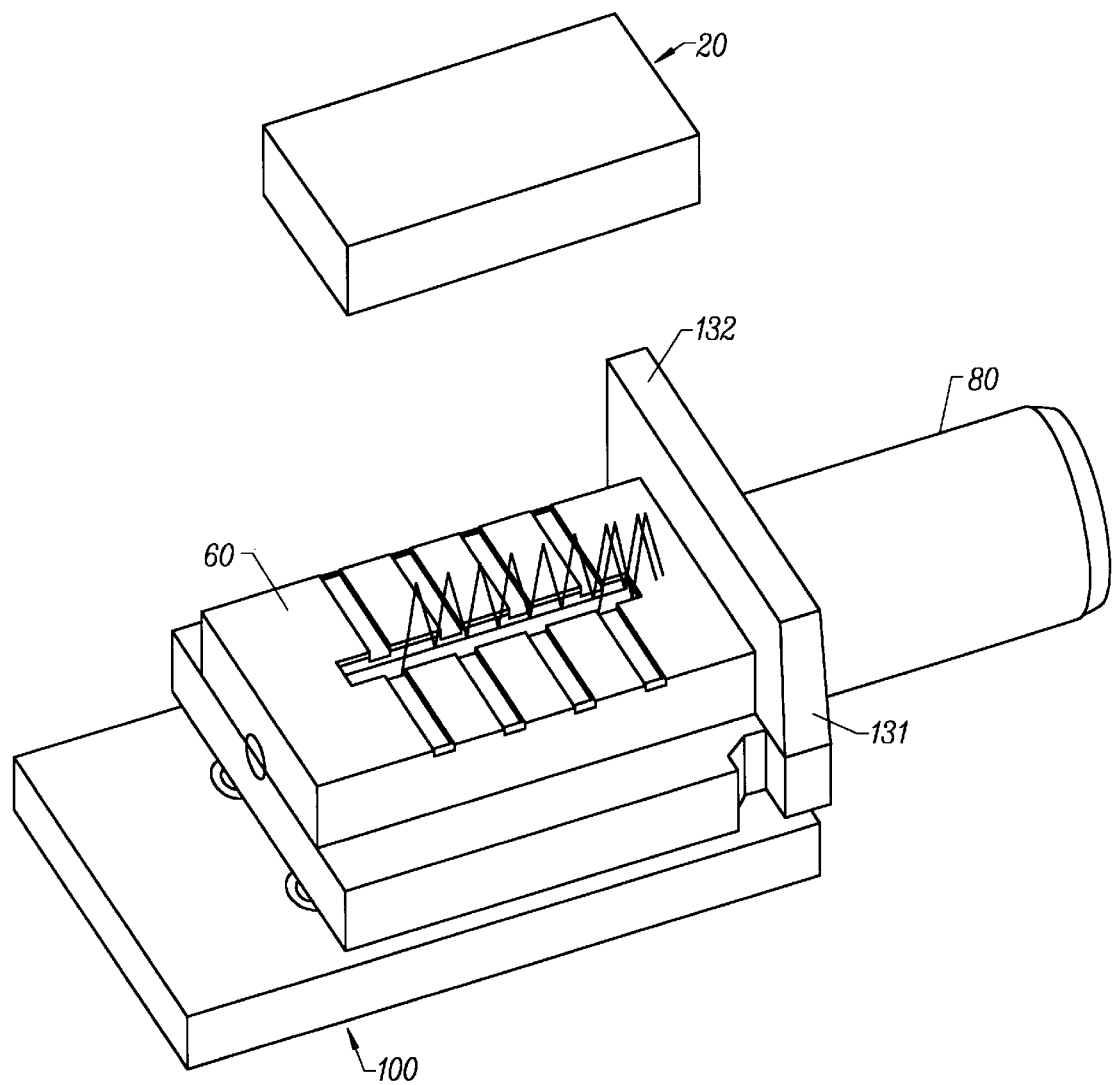
FIG. 4 is a perspective view, partially exploded, showing the WDM device with integrally molded mounting ears.
Figure 5:
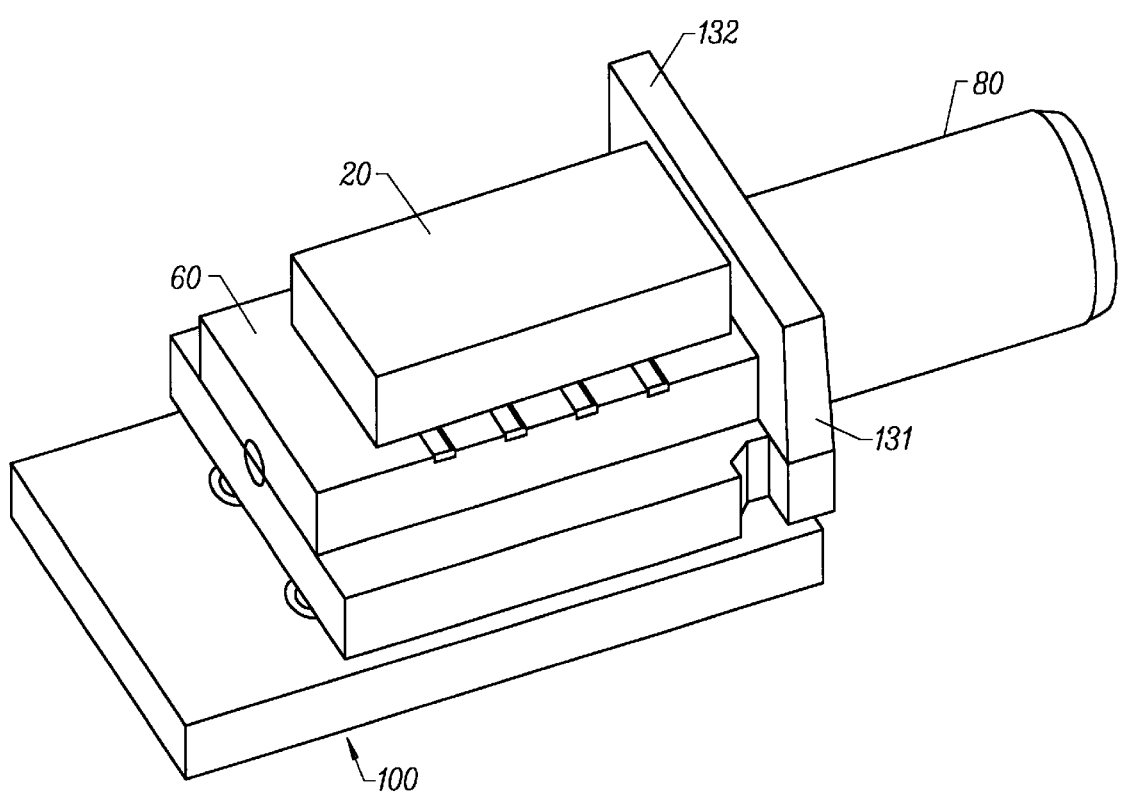
FIG. 5 is a perspective view showing the assembled device of FIG. 4.
Figure 6:
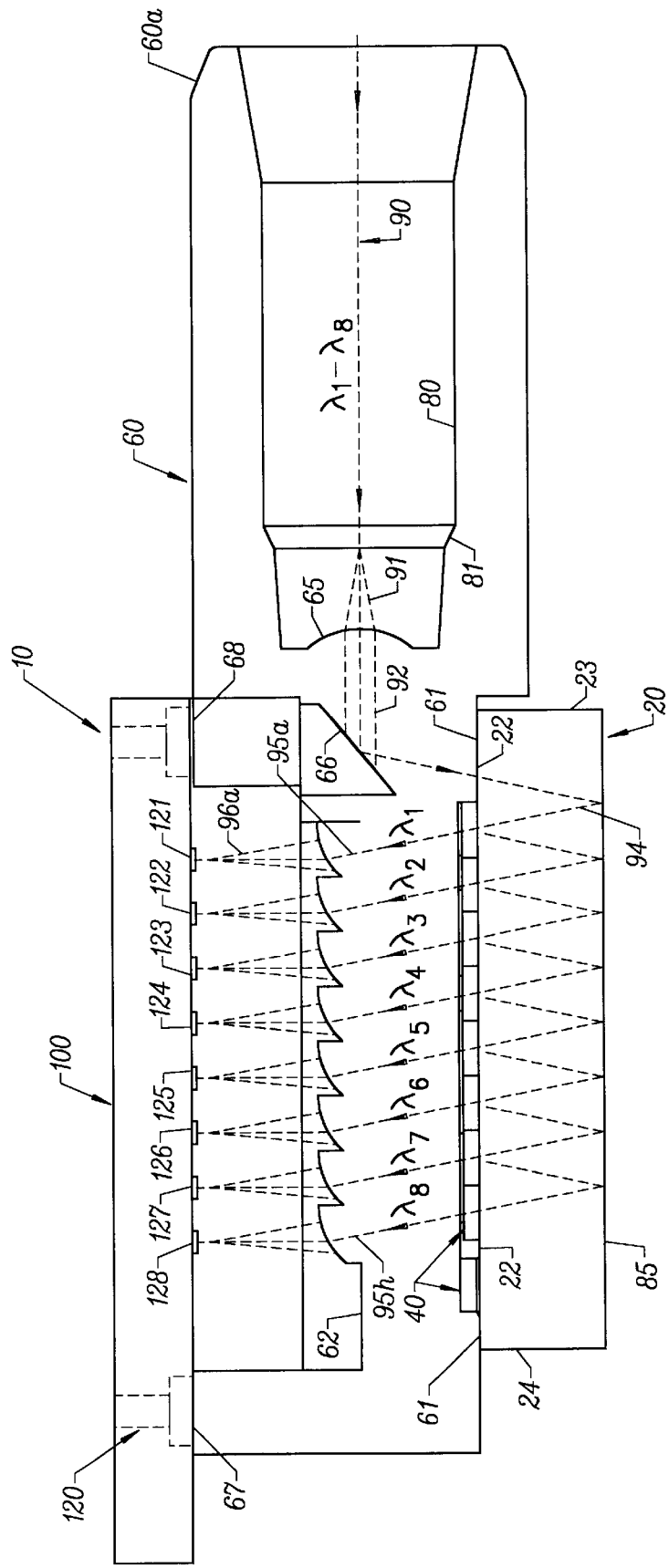
FIG. 6 shows a cross section side view of a WDM optical multiplexer/demultiplexer using the present invention.

Ceramic substrate 100 is connected to first and second mounting surfaces 67 and 68 of molded coupling module 60 (FIGS. 4 and 5). Stakes 121–124 (FIGS. 1 and 2) rigidly connect ceramic substrate 100 to molded coupling module 60 to reduce or prevent differential thermal expansion between the substrate and module.

In accordance with the present invention, mounting ear means 130 (FIG. 1) includes a pair of integrally molded mounting ears 131 and 132 integrally formed with molded coupling module 60 and extending transversely relative to the optical axis of the fiber optic cable receptacle 80. Ears 131 and 132 are formed adjacent receptacle 80 and provide mechanical strain relief for transferring loads applied to the receptacle 80 to insure that those loads do not adversely affect the optical pathway of the assembled device. The optical pathway is best illustrated in FIG. 6. The first end 60a of molded coupling module comprises the fiber optic cable receptacle and the second end 60b of molded coupling module 60 is the opposite end of module 60 which, in effect, carries the optical elements forming the optical pathway.

A pluggable housing 150 is illustrated having mounting plates 151 and 152 and a pair of resilient detents (one of which is visible in FIG. 1 as 162) formed adjacent mounting plates 151 and 152 which form a slot for receiving mounting ears 131 and 132. FIG. 2 illustrates mounting ear 132 in its assembled position in which it bears against mounting plate 152 and resilient detent 162. Mounting plate 152 and resilient detent 162 together form a support that provides mechanical strain relief pursuant to the invention. That relationship is shown in greater detail in FIG. 3. The identical support is provided for mounting ear 131 and is not described in detail. In the assembled position shown in FIG. 3, loads applied to fiber optic cable receptacle 80 are transferred to mounting block 152 and resilient detent 162 which are part of the pluggable housing support frame 150 and those loads are not transmitted to the optic and optoelectric components carried at the second end 60b of coupling module 60.

Figure 2:
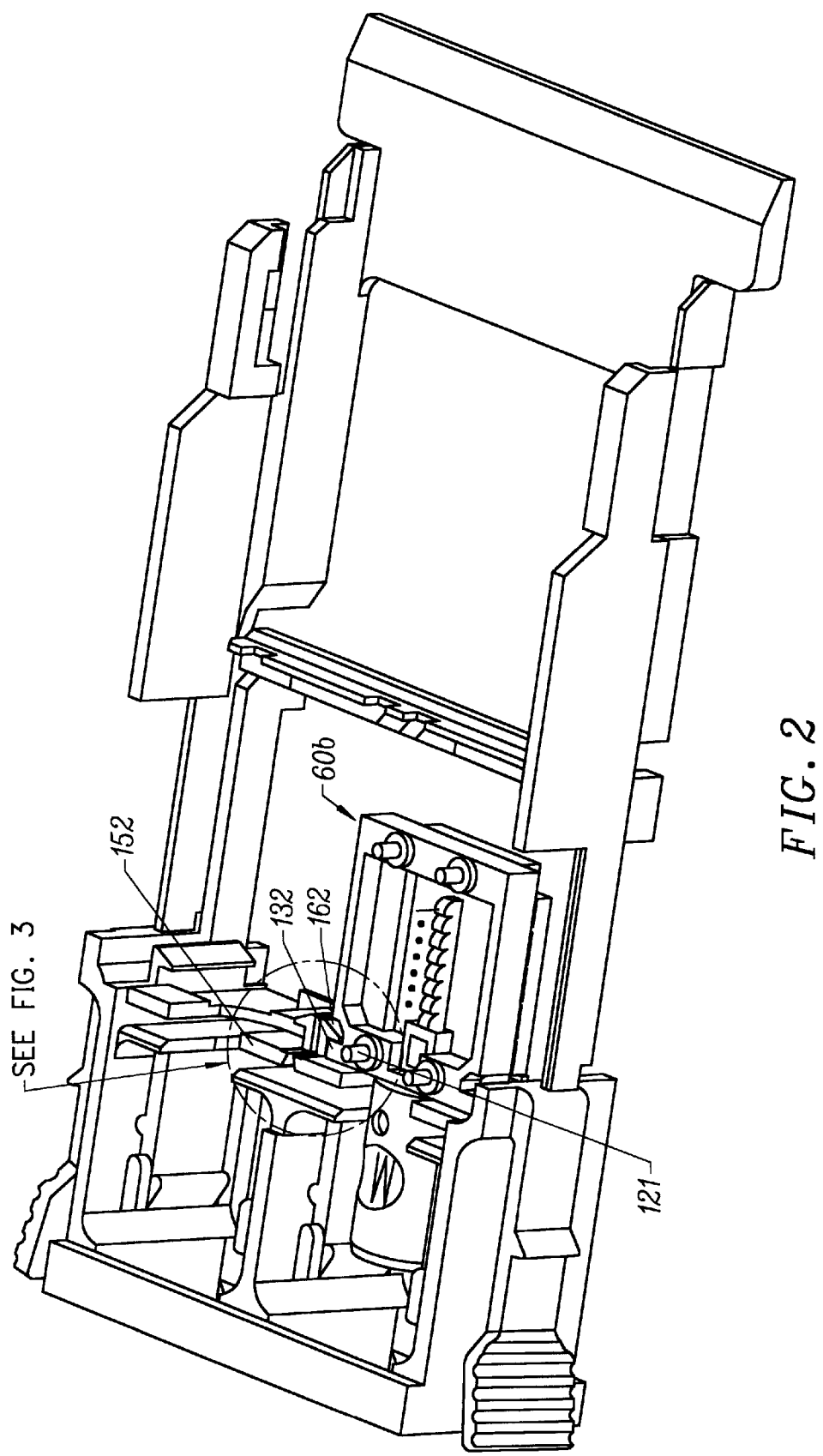
FIG. 2 is a perspective view showing the WDM device (without substrate) of FIG. 1 in its assembled position in the pluggable housing.
Figure 3:
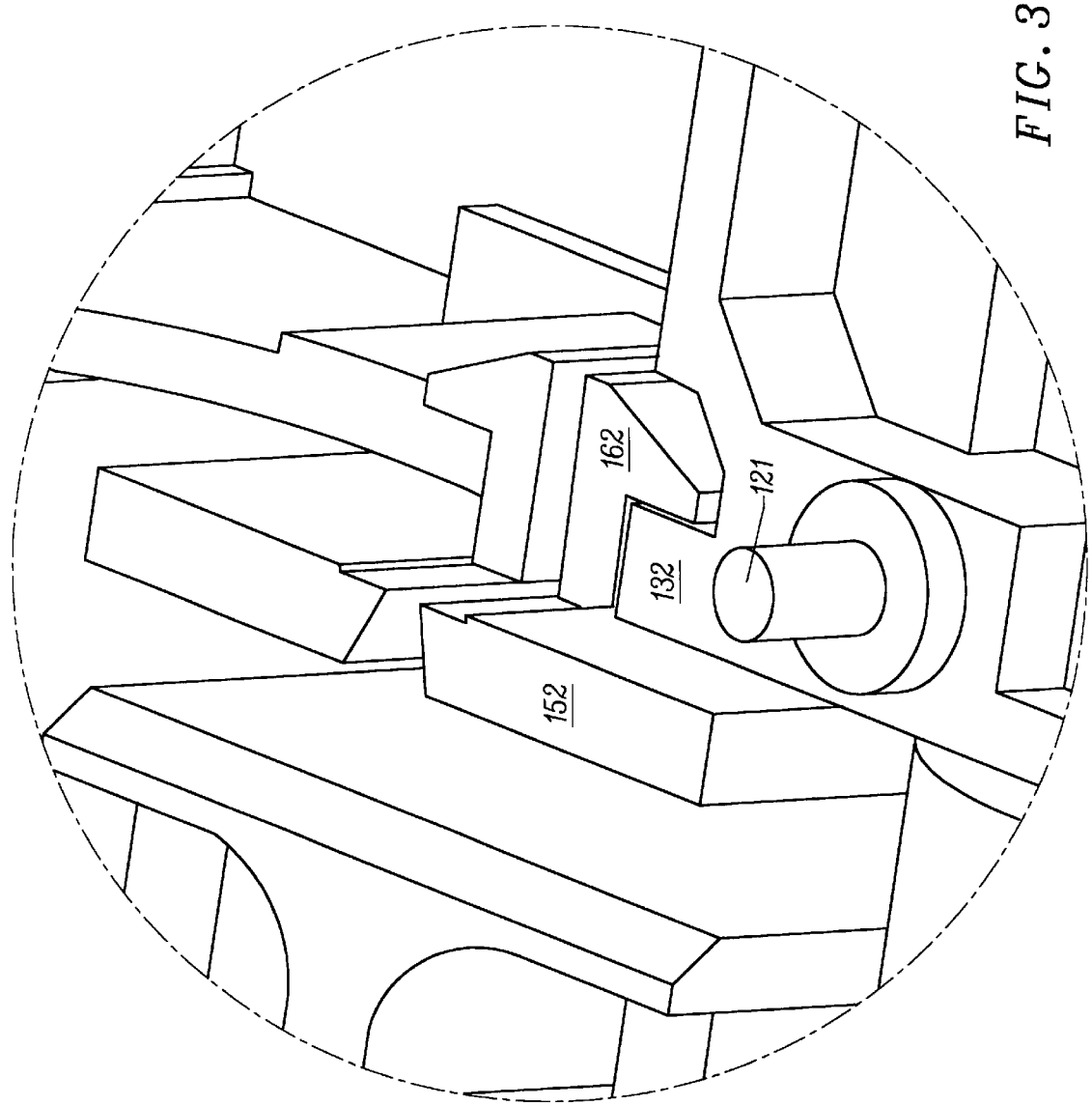
FIG. 3 is a perspective close-up of the circled region of FIG. 2.

Although FIGS. 1–3 illustrate the preferred form of the invention, the mounting ear means 130 can be alternate shapes provided they are positioned adjacent the fiber optic cable receptacle 80 in order to absorb loads directly from receptacle 80. The WDM device can be mounted in alternate pluggable housings including GBIC (gigabit interface converter) housings, as illustrated in FIGS. 1–3, as well as non-GBIC pluggable housings or modules; and in non-pluggable modules. When installed in alternate housings, mounting ears 131 and 132 are received in a pair of similar channels as provided between mounting block 152 and detent 162.

The foregoing description of the invention has been presented for purposes of illustration and description and is not intended to be exhaustive or to limit the invention to the precise form disclosed. Modifications and variations are possible in light of the above teaching. The embodiments were chosen and described to best explain the principles of the invention and its practical application to thereby enable others skilled in the art to best use the invention in various embodiments and with various modifications suited to the particular use contemplated. The scope of the invention is to be defined by the following claims.

What is claimed is:

1. In an optical wavelength division multiplexer and/or demultiplexer for single-mode or multi-mode fiber optic communication systems, wherein n channels are transmitted through a single fiber optic cable having n different wavelengths and wherein the optical couplings and alignment of the optical pathway of the device are achieved by forming and joining a prefabricated optical block to the first end of a molded coupling module to avoid post-fabrication alignment and adjustment of the optical pathway otherwise required, the improvement comprising:

a housing, a fiber optic cable receptacle carried by the second end of said molded coupling module, mounting ear means carried by said molded coupling module, and support means carried by said housing for providing mechanical strain relief for transferring loads applied to said fiber optic cable receptacle to said support means, whereby said loads applied to said receptacle do not adversely affect said optical pathway of the assembled device.

2. The apparatus of claim 1 wherein said mounting ear means are integrally molded with said coupling module.

3. The apparatus of claim 2 wherein said mounting ear means extend transversely to the optical axis of said fiber optic cable receptacle.

4. The apparatus of claim 1 further comprising a pluggable housing having a frame, and said support means comprises a pair of mounting plates and resilient detents carried by said housing and adapted to engage said mounting ear means.

5. The apparatus of claim 4 wherein said mounting plates and resilient detents form channels which receive and engage said mounting ear means.

* * * * *

UNITED STATES PATENT AND TRADEMARK OFFICE
CERTIFICATE OF CORRECTION

PATENT NO.    : 6,558,046 B2
DATED         : May 6, 2003
INVENTOR(S)   : Jeffrey A. Griffis et al.

It is certified that error appears in the above-identified patent and that said Letters Patent is hereby corrected as shown below:

<u>Column 1,</u>
Line 35, correct the sentence to read as follows:
-- The preferred embodiment of the present invention includes mounting ears integrally formed with a plastic molded coupling module wherein the module carries a fiber optic cable receptacle at one end and a plurality of optical and opto-electronic components at its other end. --

Signed and Sealed this

Twenty-fifth Day of November, 2003

JAMES E. ROGAN
*Director of the United States Patent and Trademark Office*